US 8,945,803 B2
Feb. 3, 2015

(12) United States Patent
Chen et al.

(54) SMART SUBFIELD METHOD FOR E-BEAM LITHOGRAPHY

(71) Applicant: Taiwan Semiconductor Manufacturing Company, Ltd., Hsin-Chu (TW)

(72) Inventors: Pei-Shiang Chen, Hsin-Chu (TW); Hung-Chun Wang, Taichung (TW); Jeng-Horng Chen, Hsin-Chu (TW); Cheng-Hung Chen, Zhubei (TW); Shih-Chi Wang, Taipei (TW); Nian-Fuh Cheng, Hsin-Chu (TW); Chia-Chi Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/107,540

(22) Filed: Dec. 16, 2013

(65) Prior Publication Data
US 2014/0099582 A1 Apr. 10, 2014

Related U.S. Application Data

(63) Continuation of application No. 13/484,434, filed on May 31, 2012, now Pat. No. 8,609,308.

(51) Int. Cl.
*G03F 7/20* (2006.01)
*G06F 17/50* (2006.01)

(52) U.S. Cl.
CPC .............. *G06F 17/5068* (2013.01); *G03F 7/20* (2013.01); *Y10S 430/143* (2013.01)
USPC ............... 430/30; 430/296; 430/942; 716/53; 716/55

(58) Field of Classification Search
USPC .......................... 430/30, 296, 942; 716/53, 55
See application file for complete search history.

(56) References Cited

U.S. PATENT DOCUMENTS

| 4,531,191 A | 7/1985 | Koyama |
| 6,361,911 B1 | 3/2002 | Tsai et al. |
| 7,590,966 B2 | 9/2009 | Sandstrom et al. |
| 7,842,935 B2 | 11/2010 | Aloni et al. |
| 8,609,308 B1 * | 12/2013 | Chen et al. ...................... 430/30 |
| 2006/0055903 A1 | 3/2006 | Thuren et al. |
| 2008/0001097 A1 | 1/2008 | Nakasugi et al. |
| 2013/0323648 A1 | 12/2013 | Chen et al. |

* cited by examiner

*Primary Examiner* — Christopher Young
(74) *Attorney, Agent, or Firm* — Haynes and Boone, LLP

(57) ABSTRACT

The present disclosure provides a method of improving a layer to layer overlay error by an electron beam lithography system. The method includes generating a smart boundary of two subfields at the first pattern layer and obeying the smart boundary at all consecutive pattern layers. The same subfield is exposed by the same electron beam writer at all pattern layers. The overlay error caused by the different electron beam at different layer is improved.

20 Claims, 9 Drawing Sheets

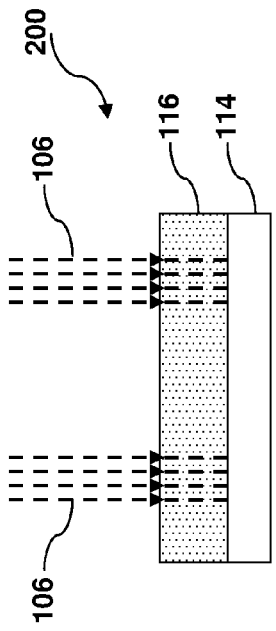
FIG. 2
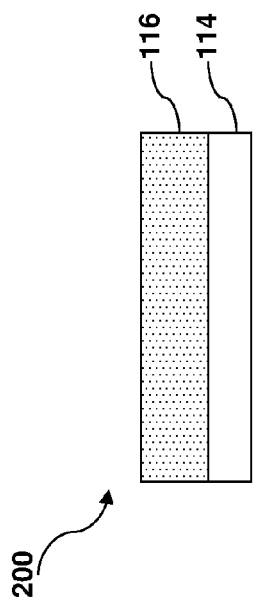
FIG. 4
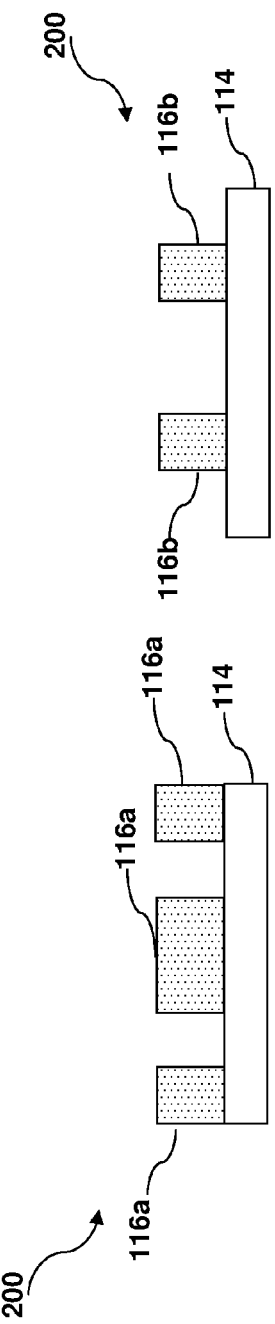
FIG. 3
FIG. 5

SMART SUBFIELD METHOD FOR E-BEAM LITHOGRAPHY

PRIORITY DATA

The present application is a continuation application of U.S. patent application Ser. No. 13/484,434, filed May 31, 2012, which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, light diffraction in an optical lithography system becomes an obstacle for further scaling down the feature size. Comment techniques used to decrease the light diffraction impact includes an optical proximity correction (OPC), a phase shift mask (PSM), and an immersion optical lithography system. An electron beam lithography system is another alternative to scale down the feature size. However, a large overlay error at a boundary area of two subfields may occur by using a different electron beam at a different pattern layer.

Accordingly, what is needed is a method to reduce the overlay error caused by the different electron beams used at the different pattern layers during the electron beam lithography patterning process.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 2-5 are cross-sectional side views illustrating forming a resist pattern according to one or more embodiments of the present disclosure.

DETAILED DESCRIPTION

Figure 1:
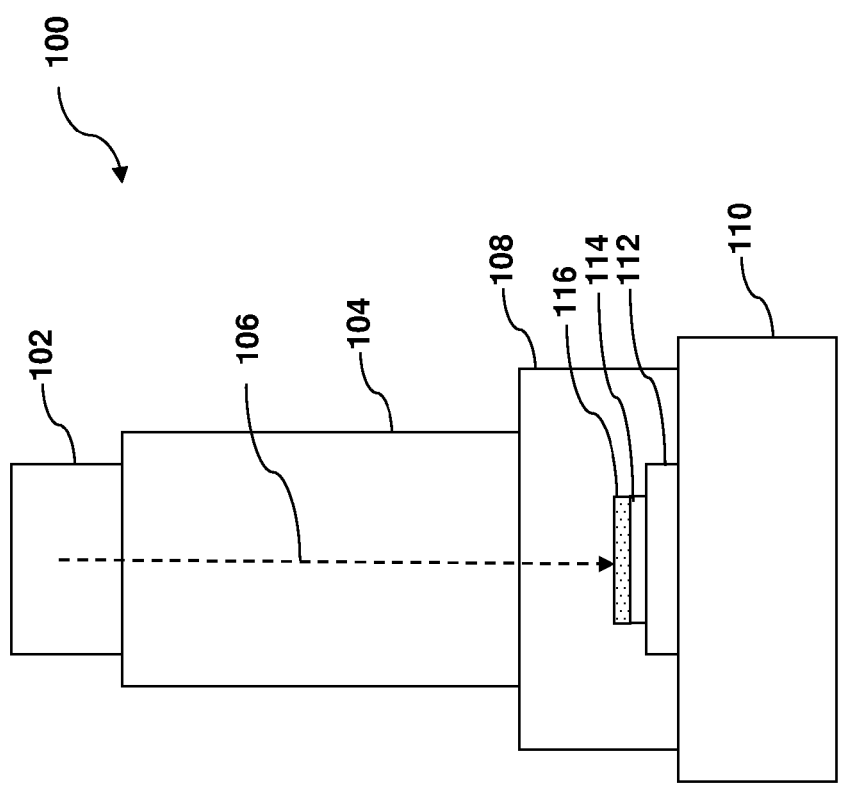
FIG. 1 represents a schematic diagram of an electron beam writer system for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, an electron beam lithography system 100 is an example of a system that can benefit from one or more embodiments of the present disclosure. The electron beam writer system 100 includes an electron source 102, an electron optical column 104, an electron beam 106, a chamber 108, a pump unit 110, a stage 112, a substrate 114, and a resist film 116 according to one or more embodiments of the present disclosure. However, other configurations and inclusion or omission of devices may be possible. In the present disclosure, the electron beam lithography system is also referred to as an electron beam writer or an e-beam writer. The electron resource 102 provides a plurality of electrons emitted from a conducting material by heating the conducting material to a very high temperature, where the electrons have sufficient energy to overcome a work function barrier and escape from the conducting material (thermionic sources), or by applying an electric field sufficiently strong that the electrons tunnel through the work function barrier (field emission sources). The electron optical column 104 is comprised of a plurality of electromagnetic apertures, electrostatic lenses, electromagnetic lenses, shaping deflectors and cell selection deflectors; and provides the electron beam 106, such as a plurality of Gaussian spot electron beams, a plurality of variable shaped electron beams and a plurality of cell projection electron beams. The chamber 108 is comprised of a wafer loading and unloading unit, and provides the wafer transportation without interrupting an operation of the electron beam lithography system 100 when loading the wafer into the system and unloading the wafer out of the system. The pump unit 110 is comprised of a plurality of pumps and filters, and provides a high vacuum environment for the electron beam lithography system 100. The stage 112 is comprised of a plurality of motors, roller guides, and tables; secures the substrate 114 on the stage 112 by vacuum; and provides the accurate position and movement of the substrate 114 in X, Y and Z directions during focus, leveling and exposure operation of the substrate 114 in the electron writer system 100.

Continuing with the present embodiments, the substrate 114 deposited with the resist film 116 is loaded on the stage 112 for the electron beam 106 exposure. In the present disclosure, the resist is also referred to as a photo resist, an electron beam resist, a resist film and a photo resist film. The substrate 114 includes a wafer substrate or a blank mask substrate. The wafer substrate includes a silicon wafer. Alternatively or additionally, the wafer may includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). A plurality of conductive and non-conductive thin films may be deposited on the wafer. For example, the conductive thin films may include a metal such as aluminum (Al), Copper (Cu), tungsten (W), nickel (Ni), titanium (Ti), gold (Au), and platinum (Pt) and, thereof an alloy of the metals. The insulator film may include silicon oxide and silicon nitride. The blank mask substrate may include a low thermal expansion material such as quarts, silicon, silicon carbide, and silicon oxide-titanium oxide compound.

Referring now to FIGS. 2-5, a process 200 can be used with the system 100 to implement one or more embodiments of the present disclosure. Referring to FIG. 2, the resist film 116 is deposited on the substrate 114 by a spin-on coating process followed by a soft bake (SB) process. The resist film 116 may include a positive tone resist or a negative tone resist. The resist film 116 may include a single resist film or a multiple layers resist film. Referring to FIG. 3, the resist film 116 is exposed by the plurality of electron beam 106 in the electron beam writer system 100 as shown in FIG. 1 to form a latent image pattern inside the resist film 116. After the exposure, a developer is applied to the surface of the resist film for developing a resist pattern. The develop process may include a post exposure process (PEB) or a post develop bake (PDB). The final resist pattern is resist tone dependent. For example, if the positive tone photo resist is applied to the substrate 114, a portion of the resist film 116 in exposed area is dissolved during the developing process; and another portion of the photo resist film 116 in the unexposed area remains and forms a patterned photo resist film 116a; and the final resist pattern is formed as shown in FIG. 4. In another example, if the negative tone photo resist is applied to the substrate 114, a portion of the photo resist film 116 in the unexposed area is dissolved during the developing process; and another portion of the photo resist film 114 in the exposed area has crosslink chemical reaction during the exposing, remains after the developing process and forms a patterned photo resist film 116b; and the final resist pattern is formed as shown in FIG. 5.

Figure 6:
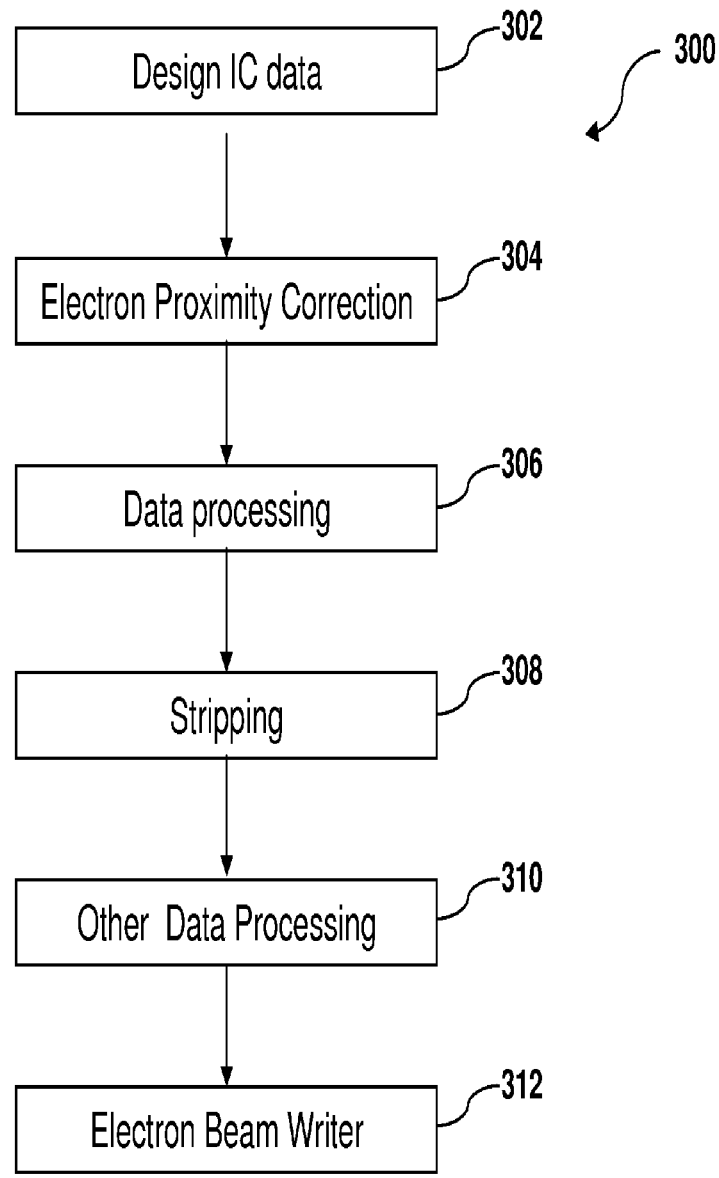
FIG. 6 is a flow chart of an integrated circuit (IC) design data flow in an electron beam writer system for implementing one or more embodiments of the present disclosure.

Referring now to FIG. 6, a method 300 includes using the electron beam writer system 100 to expose the resist film deposited on the substrate according to one or more embodiments of the present disclosure. First, the method 300 begins at step 302 by receiving an integrated circuit (IC) layout data from a designer. The designer can be a separate design house or can be part of a semiconductor fabrication facility (fab) for making IC productions according to the IC design layout data. In the present disclosure, an IC design layout data is also referred to as an IC design layout pattern. The IC design layout pattern includes a plurality of pattern layers. A typical IC design layout data is presented in a GDS file format. The method 300 proceeds to step 304 for electron proximity correction (EPC). The EPC is a compensation process for critical dimension due to an electron scattering from the substrate. The EPC process may include size bias correction, shape correction, dose correction and background dose equalization (GHOST) correction. After the EPC at step 304, the method 300 proceeds to step 306 for data processing. The step 306 includes flattening the IC design layout data into a plurality of primitive patterns such as rectangular and triangular patterns and eliminating an overlap of the primitive patterns. The method 300 continually proceeds to step 308 for a stripping process. In the stripping process, the EPC modified design layout data is divided into a plurality of strips, and each strip is divided into a plurality of subfields. The subfield may further divide into a plurality of sub-sub-field. In the present disclosure, the subfield may be also referred to as the sub-sub-field for simplicity. After the stripping process at step 308, the method 300 proceeds to step 310 for an other data processing, where an error check is performed and then the modified IC design layout data is converted to an electron beam writer format data. The step 310 also including a dithering process to convert the IC design layout pattern from a design grid to an electron beam writer grid for increasing the throughput of the electron beam lithography system 100. Eventually, the method 300 processes to step 312 for writing the IC design layout pattern on the substrate by the electron beam writer. In the present disclosure, writing the pattern on the substrate is also referred to as exposing the substrate or scanning the substrate with the patterned electron beam. Addition steps can be provided before, during, and after the method 300, and some of the steps described can be replaced, eliminated or moved around for addition embodiments of the method.

In the step 308 of the method 300 as shown in FIG. 6, the substrate is divided into the plurality of strips, and each strip is further divided into a plurality of subfields. One subfield is assigned with one patterned electron beam. Therefore, one strip contains the plurality of patterned electron beams. The IC design layout pattern is directly written on the resist film deposited on the substrate by scanning the substrate strip by strip with the plurality of patterned electron beams in the electron beam writer system. The scanning continues until the entire substrate is patterned. Because some patterns extend across the strip boundary or the subfield boundary, the butting error may occur at the subfield boundary.

Figure 7:
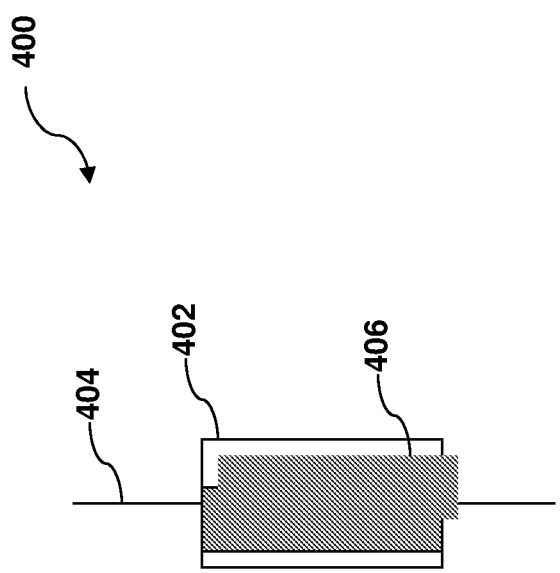
FIG. 7 is an example of a butting error at a boundary of two subfields in an electron beam writer system for implementing one or more embodiments of the present disclosure.

Referring now to FIG. 7, an example of a resist pattern error 400 at one strip boundary or at one subfield boundary is presented according to one or more embodiments of the present disclosure. A pattern 402 is an intended pattern. The pattern 402 crosses two subfields. A boundary line 404 is divided the two subfields. The pattern 402 is formed by two electron beams scanning in two adjacent subfields. A pattern 406 is the actual final pattern produced by two electron beams scans. As shown in the figure, it is noted that the pattern 406 may include CD and overlay issues.

Figure 8:
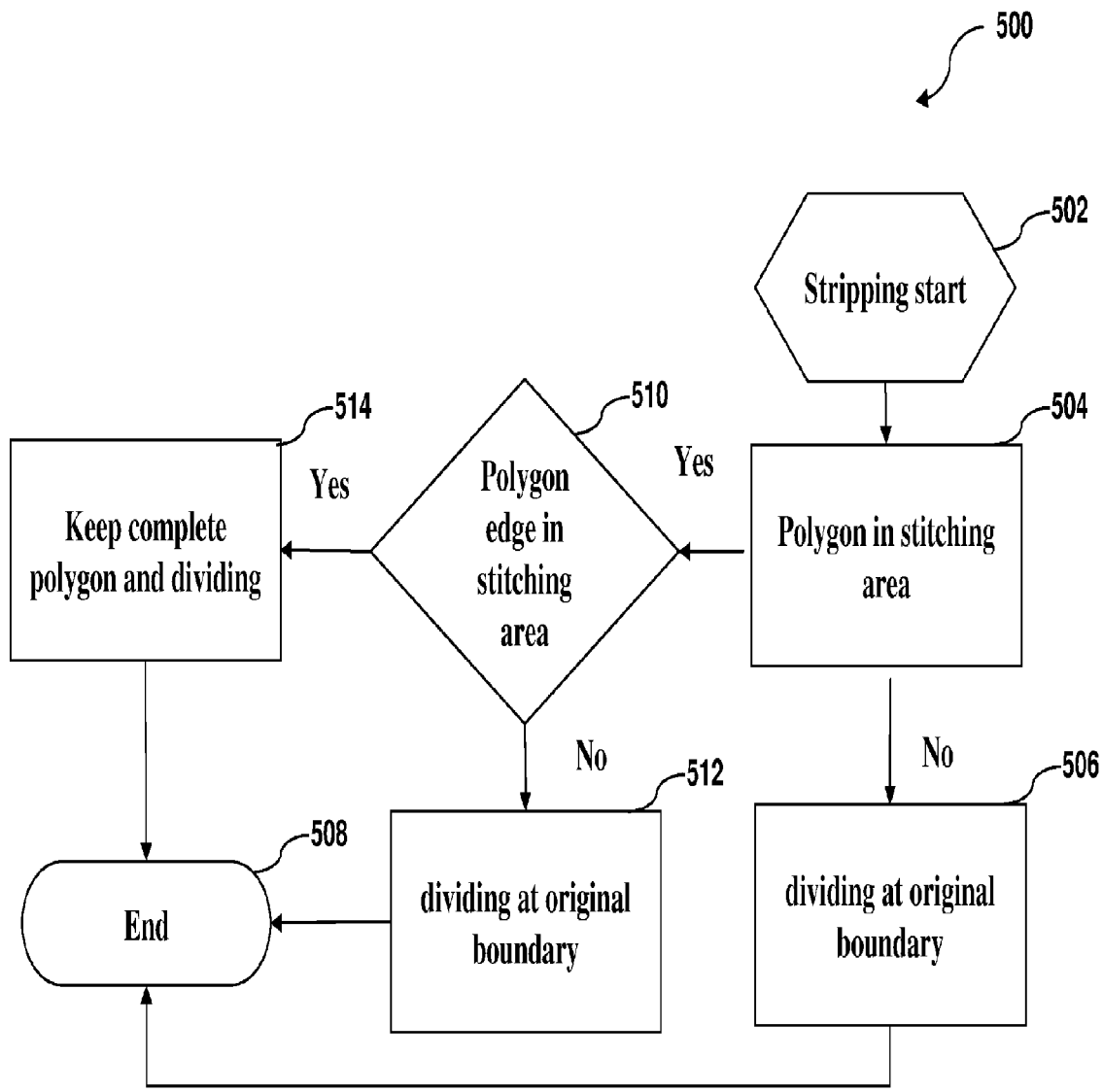
FIG. 8 is a flow chart of a first stripping method generating a smart boundary for an electron beam writer system according to one or more embodiments of the present disclosure.

Referring now to FIG. 8, a flow chart of a method 500 of stripping the EPC modified IC design layout pattern data is presented according to one or more embodiments of the present disclosure. The method 500 deals with the patterns crossing the strip boundary or the subfield boundary. The method 500 begins at block 502 by receiving the EPC modified IC design layout pattern data. The method 500 proceeds to block 504 for examining if a polygon pattern crosses an original boundary in a stitching area. The stitching area is located at the connection or interface between two subfields. At the block 504, if the polygon does not cross the original boundary in the stitching area, the method 500 proceeds to block 506 for dividing at the original boundary, and then proceeds to block 508 for finishing the stripping process. If the polygon crosses the original boundary in the stitching area, the method 500 proceeds to block 510. At block 510, the polygon is examined in more detail. If an edge of the polygon does not exist in the stitching area, the method proceeds to block 512 for dividing at the original boundary, and then proceeds to block 508 for finishing the stripping process. If the edge of the polygon exists in the stitching area, the method 500 proceeds to block 514. At block 514, the dividing boundary line is moved away from the original boundary to maintain a complete polygon crossing the original boundary, so that a butting error is avoided. At block 514, a determination is made to keep the complete polygon in the subfield in which the polygon is mostly located. After the block 514, the method proceeds to block 508 for finishing the data stripping process. A smart boundary is thereby formed by the method 500 to divide the IC design layout data into the plurality of subfields.

Figure 9:
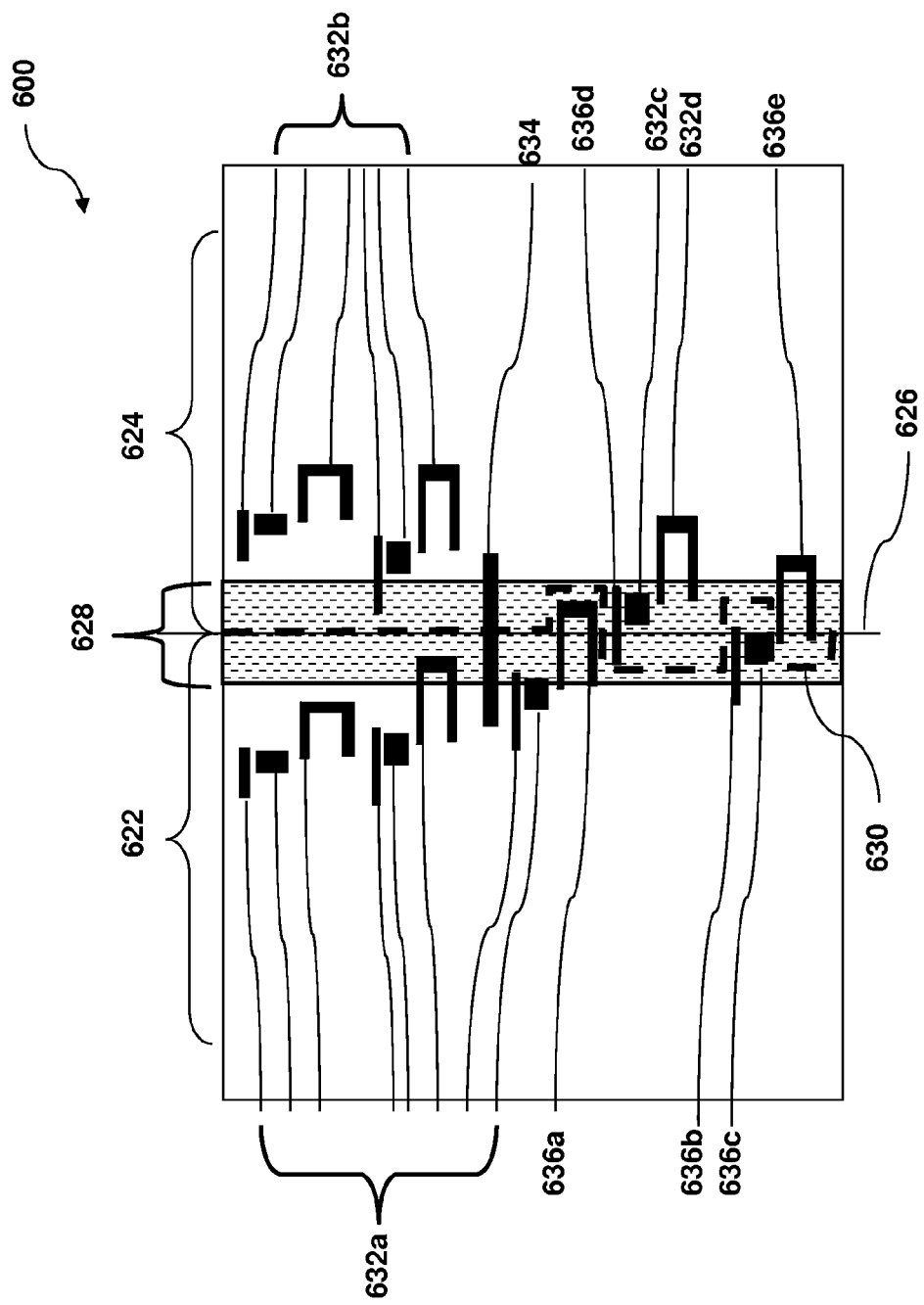
FIG. 9 is an example of using a smart boundary dividing a device pattern for an electron beam writer system according to one or more embodiments of the present disclosure.

Referring now to FIG. 9, an example of dividing two subfields of a device 600 by the method 500 is presented according to one or more embodiments of the present disclosure. In the device 600, a subfield 622 and a subfield 624 are two adjacent subfields and are divided by an original boundary line 626. A ditching area 628 is located at a connecting area shared by the subfield 622 and the subfield 624. A dividing line 630 divides the subfield 622 and the subfield 624. A plurality of polygons 632a-632d are positioned around the stitching area 628, do not cross the original boundary line 626, and belong to either the subfield 622 or the subfield 624. A long polygon 634 crosses the original boundary line 626 and the stitching area 628. A second plurality of polygons 636a-636d cross the original boundary line 626 and an edge of the polygons 636a-536d fall into the stitching area 628.

As shown in FIG. 9, the example of dividing the subfield 622 and the subfield 624 of the device 600 by the method 500 is illustrated according to one or more embodiments of the present disclosure. The polygons 632a-632d do not cross the original boundary line 626 and therefore, the subfield 622 and the subfield 624 are divided by the original boundary line 626. The polygon 634 not only crosses the original boundary line 626 but also crosses the stitching area 628, and either edge of the polygon 634 exists in the stitching area 628. Therefore, the polygon 634 is divided at the original boundary line 626. The polygons 636a-636e cross the original boundary line 626 and one edge of the polygons 636a-c falls into the stitching area 628. Therefore, the dividing line 630 moves away from the original boundary line 626 to keep the polygons 636a-636e complete. Because the polygons 636a-636c reside more in the subfield 622 than in the subfield 624, the dividing line 630 moves into the subfield 624 and keeps the full polygons 636a-636c within the subfield 622. The polygons 636d-636e reside more in the subfield 624 than in the subfield 622, therefore the dividing line 630 moves into the subfield 622 and keep the full polygons 636d-636e within the subfield 624. Thus, the smart boundary 630 is formed by the method 500 for dividing the IC design layout pattern data into the plurality of subfields to reduce and eliminate the butting errors.

It is understood that an IC device is fabricated layer by layer by a plurality of processes. Therefore, the IC design layout pattern data for the IC device includes a plurality of layers pattern data. During the fabrication of the IC device, the method 500 can be used for some or all of the layers. The boundaries may change for different layers, as appropriate.

Figure 10:
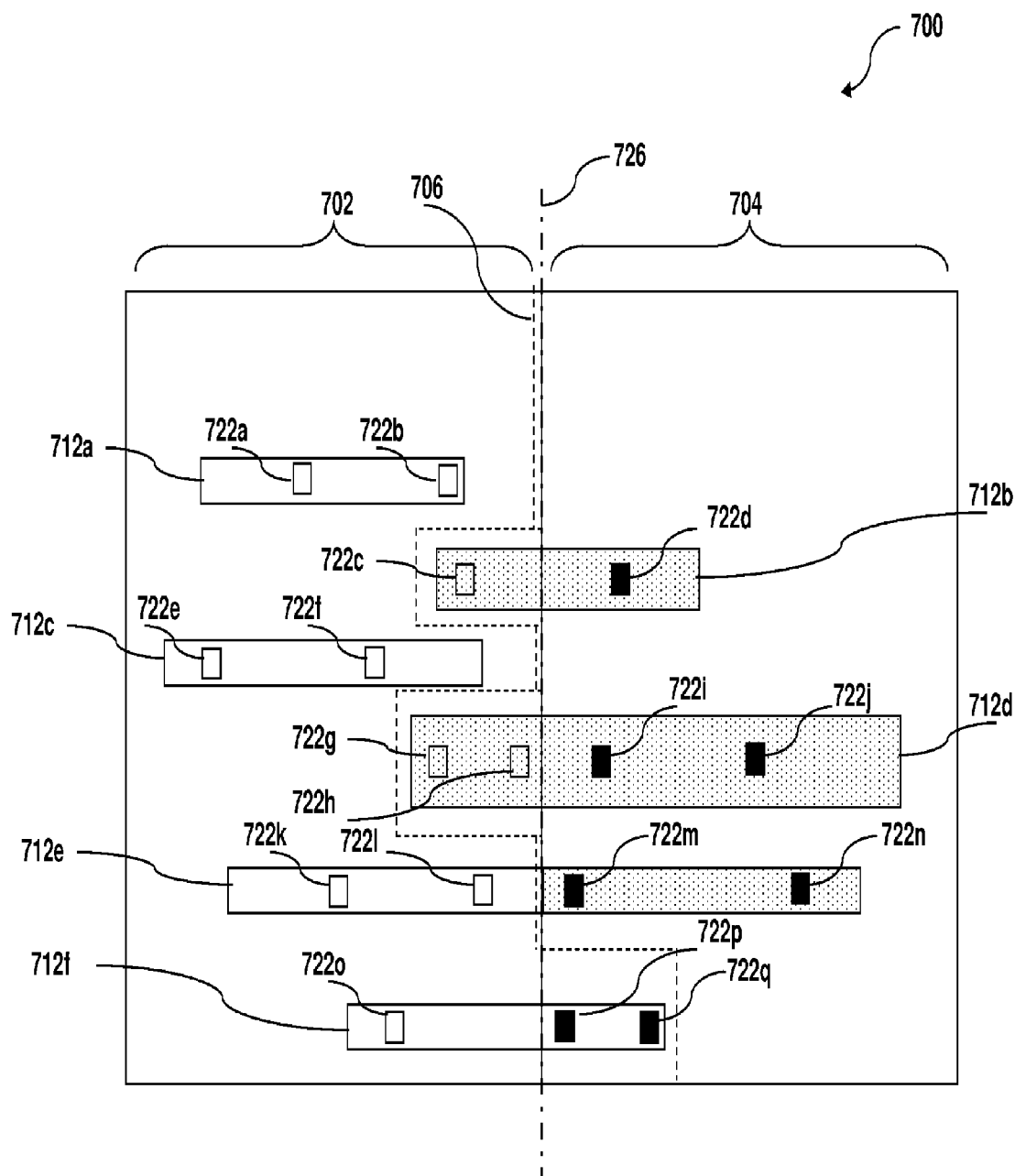
FIG. 10 illustrates a view of two pattern layers during a smart boundary process for an electron beam writer system for implementing one or more embodiments of the present disclosure.

Referring now to FIG. 10, an example of dividing two subfields of a device 700 in a first two layers by the method 500 is presented according to one or more embodiments of the present disclosure. In the device 700, a subfield 702 and a subfield 704 are two adjacent subfields. A plurality of patterns 712a-712f are fabricated in the first layer process. A boundary 706 divides the subfield 702 and the subfield 704 by the stripping method 500 at the first layer process. A plurality of patterns 722a-722g are fabricated in the second layer process. A boundary 726 divides the subfield 702 and the subfield 704 by the stripping method 500 at the second layer process. The boundary 706 for the first layer pattern is not the same as the boundary 726 for the second layer pattern. Thus, at an area of the IC device near the subfield boundary, the first layer pattern is written by one beam path and the second layer pattern is written by a different beam path. For example, the pattern 712d at the first layer is assigned to the subfield 704 by the method 500 and therefore the pattern 712d is written by the electron beam in the path assigned to the field 704. The second layer patterns 722g-722j are built on top of the first pattern 712d. By the method 500, the pattern 722g and 722h are assigned to the subfield 702 at the second layer process and therefore are written by the electron beam in the path assigned to the subfield 702; and the pattern 722i and 722j are assigned to the subfield 704 at the second layer process and therefore are written by the electron beam in the path assigned to the subfield 704. In another example, the pattern 712f at the first layer is assigned to the subfield 702 by the method 500 and therefore is written by the electron beam in the path assigned to the subfield 702. The second layer patterns 722o-722q are build on top of the first pattern 712f. By the method 500, the pattern 722o is assigned to the subfield 702 at the second layer process and therefore is written by the electron beam in the path assigned to the subfield 702; and the pattern 722p and 722q are assigned to the subfield 704 at the second layer process and therefore are written by the electron beam in the path assigned to the subfield 704.

It is further noted that there are often deviations between different electron beams such as current, focus, position error, magnification, and rotation. If the same stack is exposed by different beams at the different layers, a layer to layer overlay error may be worse than that exposed by the same beam. In the device 700 as shown in FIG. 10, the overlay of the pattern 722g and 722h to the pattern 712d may be worse than the overlay of the pattern 722i and 722j to the pattern 712d; and the overlay of the pattern 722p and 722q to the pattern 712f may be worse than the overlay of the pattern 722o to the pattern 712f.

Figure 11:
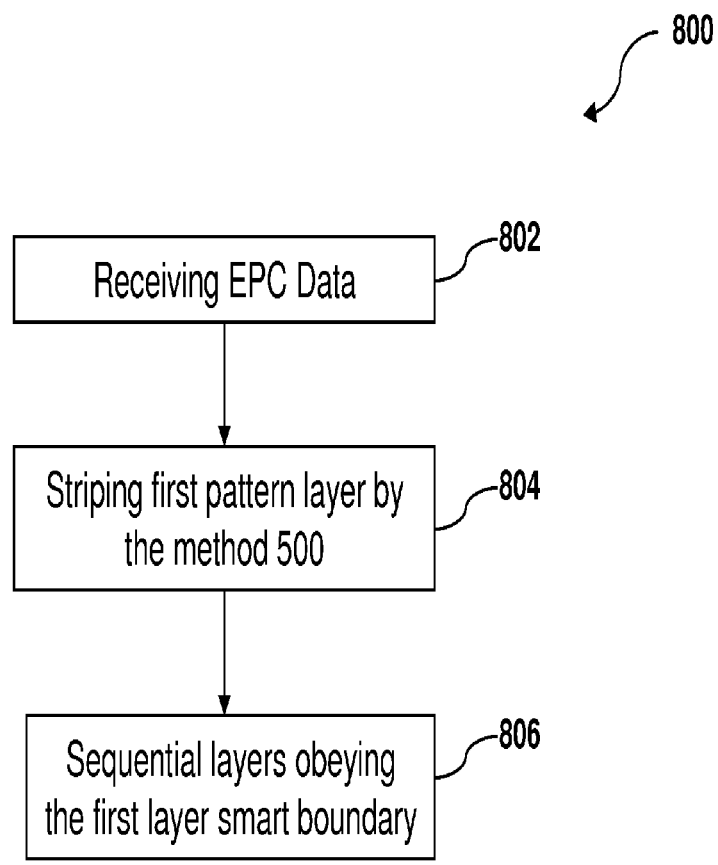
FIG. 11 is a flow chart of a second stripping method for all pattern layers for an electron beam writer system according to one or more embodiments of the present disclosure.

Referring now to FIG. 11, a flow chart of a method 800 of stripping the EPC modified IC design layout patterns is presented according to one or more embodiments of the present disclosure. The method 800 begins at block 802 by receiving the EPC modified IC design layout pattern data. Then, the method 800 proceeds to block 804 for stripping the first layer pattern. At the block 804, the first layer pattern of the IC design layout is divided into a plurality of subfields by the smart boundary method 500 as shown in FIG. 8. After the block 804, the method 800 proceeds to block 806. At the block 806, a plurality of consecutive pattern layers obeys the smart boundary set at the first layer pattern. Thus, all the subfields are written by the same electron beams at the different layers to improve the lay to lay overlay error caused by the different electron beam properties.

Figure 12:
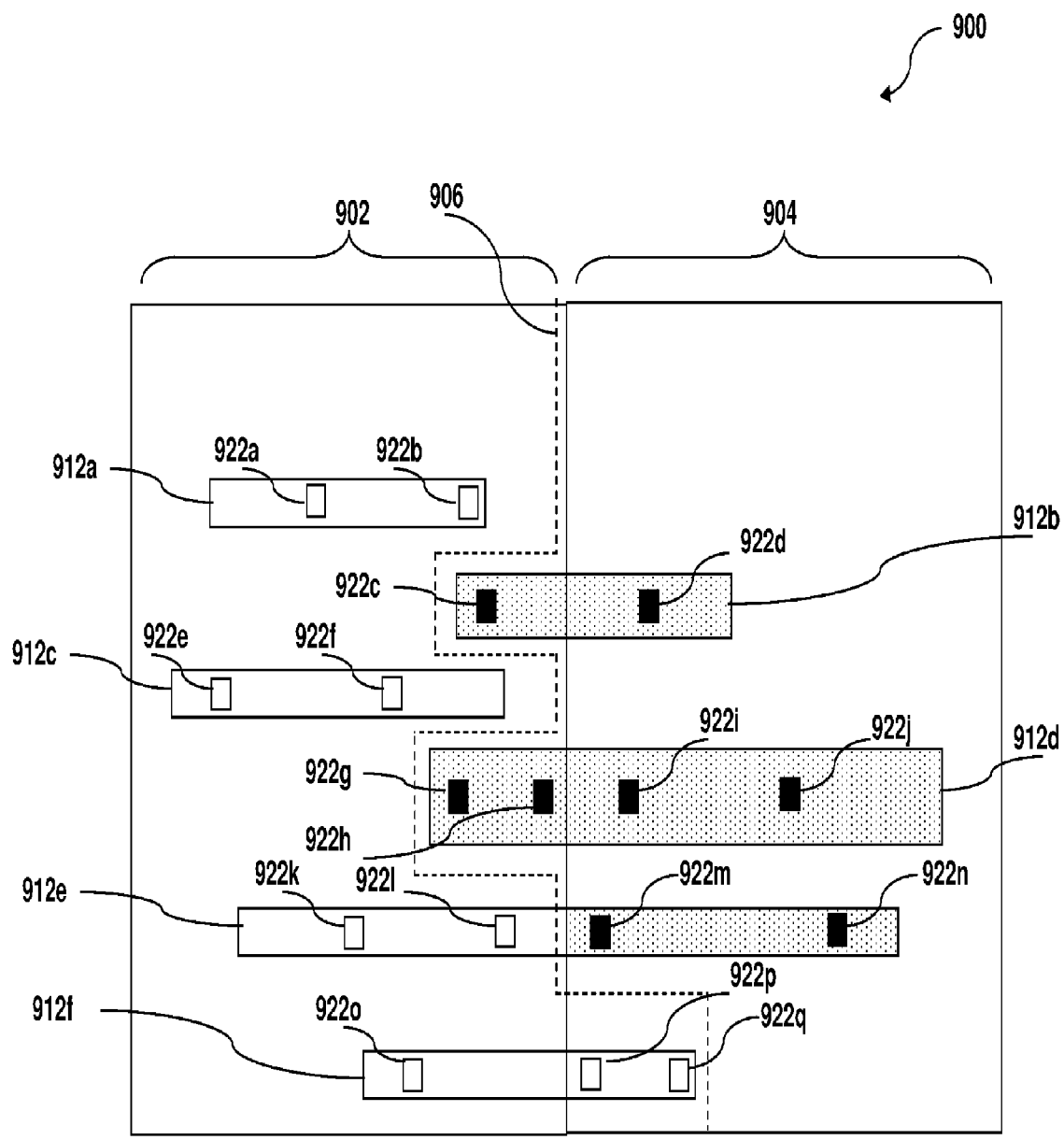
FIG. 12 illustrates a view of two pattern layers using a smart boundary for all pattern layers for an electron beam writer system for implementing one or more embodiments of the present disclosure.

Referring now to FIG. 12, an example of dividing two subfields of a device 900 in the first two layers by the method 800 is presented according to one or more embodiments of the present disclosure. In the device 900, a subfield 902 and a subfield 904 are two adjacent subfields. A plurality of patterns 912a-912f are fabricated in a first layer process. A boundary 906 divides the subfield 902 and the subfield 904 by the stripping method 800 at the first layer process. A plurality of patterns 922a-922g are fabricated in a second layer process. A boundary for the second layer pattern obeys the boundary 906 set at the first layer. Thus, the patterns of the different layers at the same stack crossing the subfields boundary are written by the same electron beams at the different level, and any layer-to-layer overlay errors caused by different electron beams are improved. For example, the overlay error of the pattern 922g and the pattern 922h to the pattern 912d as shown in FIG. 12 may be reduced by fifty percent (50%) compared with the overlay error of the pattern 722g and the pattern 722h to the pattern 712d as shown in FIG. 10. In another example, the overlay error of the pattern 922p and the pattern 922q to the pattern 912f as shown in FIG. 12 may also be reduced by fifty percent (50%) compared with the overlay error of the pattern 722p and the pattern 722q to the pattern 712f as shown in FIG. 10.

Thus, the present disclosure describes a method of exposing the resist film deposited on the substrate in the electron beam writer to improve the overlay error. A smart boundary dividing a plurality of subfields is set at the first pattern layer and the consecutive pattern layers obey the smart boundary set at the first pattern layer. Because the subfield is exposed by the same electron beam at the different layers, the overly error caused by the different electron beam is improved.

The present disclosure also describes a method of generating the smart boundary during exposing the resist film by the electron beam writer. The smart boundary is set by examining if a polygon edge is in or out of a stitching area shared by the two adjacent subfields to keep a complete polygon in the subfield at the first pattern layer. Then the consecutive pattern layers obey the smart boundary set at the first pattern layer. The overlay error caused by the electron beam difference is reduced.

In another embodiment, a method of forming a photo resist pattern on the electron beam writer. The photo resist is deposited on the substrate by a spin-on process to form a photo resist film. The photo resist film deposited on the wafer substrate is exposed on the electron beam writer by using the smart boundary for the subfields set at the first pattern layer. The same subfield is exposed at the consecutive layers by the same electron beam and therefore the layer to layer overlay is improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning a substrate, comprising:
receiving an integrated circuit (IC) design layout data comprising at least one main feature;
modifying the at least one main feature using an electron proximity correction (EPC) technique;
stripping the at least one EPC modified main feature into a plurality of subfields;
converting the at least one EPC modified main feature to a plurality of electron beam writer formatted features; and
writing the plurality of electron beam writer formatted features onto the substrate by an electron beam writer.

2. The method of claim 1, wherein each of the subfields is assigned with one of the corresponding electron beam writer formatted features.

3. The method of claim 1, further comprising:
flattening the IC design layout data, wherein flattening the IC design layout data includes at least one of decomposing the IC design layout data into primitive patterns and eliminating an overlap of the primitive patterns.

4. The method of claim 1, wherein the EPC technique includes at least one of a dose correction, a pattern size bias correction, a pattern shape correction, and a background dose equalization correction.

5. The method of claim 1, wherein the stripping further comprising examining if there is a polygon crossing an original boundary in a stitching area shared by two adjacent subfields, redefining a new boundary such that the whole polygon is within one of the two adjacent subfields.

6. The method of claim 5, wherein the polygon is in a first layer and the method further comprising:
modifying the original boundary for consecutive layers by conforming to the redefined new boundary at the first layer.

7. The method of claim 1, wherein the stripping further comprising examining if there is a polygon crossing an original boundary out of a stitching area shared by two adjacent subfields, redefining at least one new boundary by dividing the original boundary.

8. The method of claim 7, wherein the polygon is in a first layer and the method further comprising:
modifying the original boundary for consecutive layers by conforming to the redefined at least one new boundary at the first layer.

9. The method of claim 1, further comprising:
dithering the plurality of the EPC modified main features.

10. The method of claim 9, wherein dithering includes converting a plurality of the EPC modified layout pattern from a design grid to an electron beam writer grid.

11. The method of claim 9, wherein converting includes converting the dithering modified IC design layout data to the plurality of electron beam writer formatted features.

12. The method of claim 1, wherein writing includes scanning the substrate coated with a photo resist film by using the plurality of electron beam writer formatted features assigned to the subfields, so that the scanning exposes the photo resist film.

13. A method of exposing a substrate, comprising:
receiving an integrated circuit (IC) design layout data comprising at least one main feature;
performing an electron proximity correction (EPC) to the at least one main feature;
stripping the at least one EPC modified main feature into a plurality of subfields;
converting the at least one EPC modified main feature to a plurality of electron beam writer format data; and
writing the electron beam writer format data on a substrate by an electron beam writer.

14. The method of claim 13, wherein each of the subfields is assigned with one of the corresponding electron beam writer format data.

15. The method of claim 13, further comprising:
flattening the IC design layout data.

16. The method of claim 13, further comprising:
examining if there is a polygon crossing an original boundary in a stitching area shared by two adjacent subfields at the first layer;

if the original boundary exists in the stitching area, redefining a new boundary such that the full polygon is within one of the two adjacent subfields; and if the original boundary being out of the stitching area, redefining a new boundary by dividing the original boundary.

17. The method of claim 16, wherein the polygon is in a first layer and the method further comprising:

modifying the original boundary for consecutive layers by conforming to the redefined new boundary at the first layer.

18. The method of claim 13, wherein writing includes scanning the substrate coated with a photo resist film by the electron beam writer using the plurality of patterned electron beam writer format data, so that the scanning exposes the photo resist film.

19. A method of patterning a substrate, comprising:

depositing a resist film on a substrate;

receiving a pattern including a plurality of polygons;

receiving a beam path mapping for an electron beam writer;

modifying at least one edge of one of the plurality of polygons so that the polygon fits into one beam path to form a modified pattern, wherein the plurality of polygons further includes a plurality of subfields;

converting the modified pattern to a plurality of electron beam formats prior to exposing, wherein each of the subfields is assigned with one of the electron beam formats;

exposing the resist film deposited on the substrate by the electron beam writer using the modified pattern; and developing the exposed resist film to form a resist pattern on the substrate.

20. The method of claim 19, wherein the pattern is an integrated circuit (IC) design layout and wherein modifying includes applying an electron proximity correction (EPC) to form an EPC modified design layout and stripping the EPC modified IC design layout into a plurality of subfields.

* * * * *